United States Patent

Ariyavisitakul et al.

[11] Patent Number: 6,012,161
[45] Date of Patent: Jan. 4, 2000

[54] SYSTEM AND METHOD FOR JOINT CODING AND DECISION FEEDBACK EQUALIZATION

[75] Inventors: Sirikiat Lek Ariyavisitakul, Tinton Falls; Ye Li, Atlantic Highlands, both of N.J.

[73] Assignee: AT&T Corp., New York, N.Y.

[21] Appl. No.: 08/979,982

[22] Filed: Nov. 26, 1997

[51] Int. Cl.[7] .............................. G06F 11/10; H03M 13/12
[52] U.S. Cl. .......................... 714/795; 714/786; 375/233; 375/341
[58] Field of Search ................................. 714/795, 786; 375/341, 340, 348, 232–234

[56] References Cited

U.S. PATENT DOCUMENTS

| | | | |
|---|---|---|---|
| 5,031,195 | 7/1991 | Chevillat et al. | 375/234 |
| 5,546,430 | 8/1996 | Liao et al. | 375/341 |

*Primary Examiner*—Emmanuel L. Moise
*Attorney, Agent, or Firm*—Oliff & Berridge, PLC

[57] ABSTRACT

The invention relates to joint decision feedback equalization and error correction decoding. To minimize error propagation, the invention uses a combination of enhanced soft decisions and delayed tentative hard decisions from the error correction (Viterbi) decoder to cancel intersymbol interference. Soft decisions are obtained by passing the DFE output through a hyperbolic arc tangent (soft) nonlinear device. These are used to suppress intersymbol interference (ISI) due to multipath with small delays. Tentative hard decisions from a Viterbi decoder are used to cancel ISI due to multipath with large delays, thus remedying the increasing effect of error propagation in channels with large delay spreads. When further combined with antenna diversity and a reduced-complexity DFE concept with adaptive feedforward tap assignment, the invention provides high packet throughput against Rayleigh fading, severe delay spreads, and high Doppler rates.

31 Claims, 9 Drawing Sheets

SYSTEM AND METHOD FOR JOINT CODING AND DECISION FEEDBACK EQUALIZATION

BACKGROUND OF THE INVENTION

1. Field of Invention

The invention relates to communication technology, and more particularly to the decoding of broadband wireless communication signals.

2. Description of Related Art

Broadband wireless technology will have an important role in the future evolution of advanced global telecommunications. Providing multimedia access to portable terminals requires a high-speed but low-complexity wireless technique to combat fading and multipath propagation, while minimizing the power requirement of the wireless modem. Multicarrier modulation, which divides the total signal bandwidth into many narrowband subchannels to be transmitted in parallel, is an attractive known technique to overcome the problem of multiple time-delayed arrivals of symbols, or multiple delay spread. However, a multicarrier signal with a large number of subchannels has a large peak-to-average power ratio, and thus requires the use of highly linear transmit amplifiers which are not power-efficient.

Another known candidate wireless technology is an equalized single-carrier system using quaternary phase shift keying (QPSK) and a decision feedback equalizer (DFE). This technique relies on adaptive signal processing to undo the effects of the delay spread. While thought to be difficult to implement for channels with severe dispersions (e.g., delay spreads on the order of several tens of the symbol period), low-complexity DFE techniques are known in the art which employ a reduced number of feedforward filter taps and a training-free feedback filter. These can lead to low training overhead and practical hardware realization.

However, another challenge with the DFE approach is to overcome error propagation. In practical wireless systems, error correction coding is an important technique needed to achieve reliable coverage in cellular systems with high frequency reuse. Most coding techniques are designed to correct random errors. A DFE, however, produces errors that are bursty in nature. This is due to the fact that the DFE relies on delay-free hard decisions (before decoding) to cancel intersymbol interference (ISI) in subsequent data symbols, so decoding errors tend to trigger strings of improper cancellation. The resulting error propagation severely limits the achievable coding gain of any error correction technique.

A number of schemes have been proposed in the art to remedy the error propagation problem. Those include: (i) Transmitter preceding (see M. Tomlinson, "New automatic Equalizers Employing Modulo Arithmetic", Electronics Letters, vol. 42, pp. 138–139, March 1971; and R. Price, "Nonlinearly Feedback-Equalized PAM vs. Capacity, for Noisy Filter Channels," IEEE ICC'72, Philadelphia, Pa., June 1972, pp. 22-12 to 22-17; the disclosures of each being incorporated herein by reference); (ii) use of interleaving to introduce delay necessary for reliable feedback (see M. V. Eyuboglu, "Detection of Coded Modulation Signals on Linear, Severely Distorted Channels using Decision-Feedback Noise Prediction with Interleaving," IEEE Transactions on Communications, vol. 36, pp. 401–409, April 1988; K. Zhou, J. G. Proakis and F. Ling, "Decision-Feedback Equalization of Time-Dispersive Channels with Coded Modulation," IEEE Transactions on Communications, vol. 38, pp. 18–24, January 1990; and T. Wang and C. L. Wang, "On Adaptive Decision-Feedback Equalization of Intersymbol Interference Channels in Coded Modulation Systems", IEEE Transactions on Communications, vol. 44, pp.1 1404–1412, November 1996; the disclosures of each being incorporated herein by reference); and (iii) use of tentative or soft decisions for feedback (see O. Agazzi and N. Seshadri, "On the Use of Tentative Decisions to Cancel Intersymbol Interference and Nonlinear Distortion With Application to Magnetic Recording Channels," IEEE Transactions on Information Theory, vol. 43, pp. 394–408, March 1997; S. H. Muller, W. H. Gerstacker and J. B. Huber, "Reduced-state Soft-Output Trellis-Equalization Incorporating Soft Feedback," IEEE GLOBECOM '96, London, UK, November 1996, pp. 95–100; and H. Igarashi, K. Ueda, K. Murakami and T. Fujino, "Performance of a Soft-Output Adaptive Equalizer Combined with Soft-Decision Metrics Generator based on Differential Detection," IEEE VTC '97, Phoenix, Ariz., May 1997, pp. 700–704; the disclosure of each being incorporated herein by reference).

Each of these solutions has drawbacks. Transmitter preceding requires a priori channel information which is not available in many wireless systems. The interleaving approach requires the DFE to be implemented in a noise-predictive form, with independent adaptations of the feedforward and feedback filters. From a performance perspective, a noise-predictive structure is not desirable for a low-complexity DFE with a short feedforward filter, as known in the art. Known proposed techniques based on soft decisions are prohibitively complex to implement.

SUMMARY OF THE INVENTION

The system and method of the invention overcoming these and other problems in the art relates to a new basic approach for joint convolutional coding and DFE based on the use of enhanced soft decision. In a first illustrative embodiment, soft decisions are obtained by passing the DFE output through a streamlined soft (nonlinear) function that approximates the optimum result. That function is a specially derived hyperbolic tangent function with a fixed SNR parameter $\gamma$. On wireless channels with diversity, this streamlined soft decision technique can perform almost as well (within 0.5 dB in required SNR, assuming $\gamma=0$ dB) as the optimum soft feedback based on known optimal (MAP, maximum a posteriori probability) algorithms with high implementation complexity.

In a second illustrative embodiment, tentative decisions from a Viterbi decoder which is used for error correction are fed back with delay both to cancel ISI caused by multipath with large delays, and to adapt the DFE taps in channel tracking mode. Results indicate that the combination of the first and second embodiments of the invention can perform within only 1 to 2 dB in required SNR of an ideal coded DFE performance, without error propagation. When further combined with antenna diversity and adaptive feedforward tap assignment (see S. Ariyavisitakul, N. R. Sollenberger and L. J. Greenstein, "Tap-Selectable Decision Feedback Equalization," IEEE ICC '97, Montreal, Canada, June 1997, pp. 1521–1526 the disclosure of which is incorporated herein by reference), the invention thus provides robust performance against fading, severe delay spreads, and high Doppler rates. The combination of the first and second illustrative embodiments of the invention is for instance applicable to known low-complexity DFE techniques (see S. Ariyavisitakul and L. J. Greenstein, "Reduced-Complexity Equalization Techniques for Broadband Wireless Channels", IEEE Journal of Selected Areas in Communications, Vol. 15, pp. 5–15, January 1997, the disclosure of which is incorporated herein by reference).

The system and method of the invention thus offers multiple advantages, including (i) a streamlined but near-optimal soft feedback technique, (ii) a new basic joint approach for convolutional coding and DFE, and (iii) demonstration (through computer simulations) that the invention can be used in broadband wireless systems to provide high packet throughput despite fading and severe ISI.

BRIEF DESCRIPTION OF THE DRAWINGS

The invention will be described in conjunction with the following drawings in which like reference numerals designate like documents and wherein.

DETAILED DESCRIPTION OF PREFERRED EMBODIMENTS

I. First Illustrative Embodiment of the Invention

A. Optimum Soft Feedback

Before describing the first illustrative embodiment of the invention including a new enhanced soft decision approach, a known approach for estimating optimum soft feedback using an MAP algorithm is first described. The invention incorporates a simplified soft decision method which closely approximates the optimum approach, but at much reduced computing cost.

Figure 1:
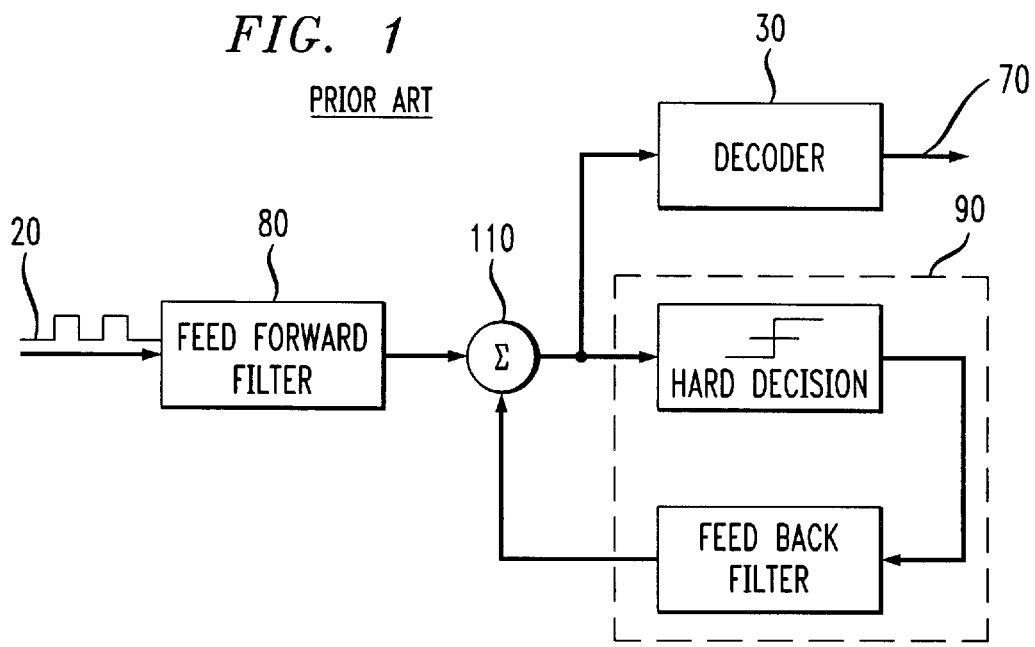
FIG. 1 illustrates a decoder according to conventional receiver design using a hard decision rule and feedback filter.

Optimum soft feedback (illustrated in FIG. 1, particularly MAP feedback unit 90) is obtained when the residual error between estimated received signals and actual signals $\tilde{x}_n - x_n$ is minimized in a mean square sense:

$$E(|\tilde{x}_n - x_n|^2 \mid y_n) \to \min \qquad \text{Equation 1}$$

where E( ) denotes expected value, and $y_n = Y_1, \ldots, Y_n$ is a sequence of all available observations at time n. The solution to (1) is known in the art and can be given as $$\overline{X}_n = E(x_n \mid y_n) \sum_{\forall x_N} x_n P(x_n \mid y_n) \qquad \text{Equation 2}$$

where $P(x_n|y_n)$ is the a posteriori probability of $x_n$.

A number of known MAP algorithms (for example, those described in L. R. Bahl, J. Cocke, F. Jelinek and J. Raviv, "Optimal Decoding of Linear Codes for Minimizing Symbol Error Rate," IEEE Transactions on Information Theory, vol. 20, pp. 284–287, March 1974; L.-N. Lee, "Real-Time Minimal-Bit-Error Probability Decoding of Convolutional Codes," IEEE Transactions on Communications, vol. 22, pp. 146–151, February 1974; the disclosures of each being incorporated herein by reference), can be used to estimate P $(x_n|y_n)$. One method will be used both as an example to evaluate the complexity of conventional MAP algorithms, and as a benchmark to compare performance of the soft decision technique used in the first illustrative embodiment of the invention.

Lee's method computes $P(x_n|y_n)$ as follows:

$$P(x_n \mid y_n) = \frac{P(x_n, y_n)}{P(y_n)} \qquad \text{Equation 3}$$

$$= \frac{\sum_{\forall s_n} P(x_n, y_n, s_n)}{\sum_{\forall s_n} P(y_n, s_n)} \qquad \text{Equation 4}$$

where $s_n$ represents a state in the decoding trellis at time n. Lee's method provides two useful equations for computing P $(x_n, y_n, s_n)$ and $P(y_n, s_n)$ A recursion formula for computing $P(y_n, s_n)$:

$$P(y_n, s_n) = \frac{1}{2} \sum_{s_{n-1} \in p(s_n)} P(y_{n-1}, s_{n-1}) P(y_n \mid x(s_{n-1}, s_n)) \qquad \text{Equation 5}$$

where $x(s_{n-1}, s_n)$ denotes the transit symbol corresponding to the branch from state $s_{n-1}$ to state $s_n$, and $\pi(s_n)$ represents all previous states of $s_n$.

The relationship between $P(x_n, y_n, s_n)$ and $P(y_n, s_n)$:

$$P(x_n, y_n, s_n) = \begin{cases} P(y_n, s_n) & \text{if } x_n = x(s_{n-1}, s_n) \\ 0 & \text{otherwise} \end{cases} \qquad \text{Equation 6}$$

Using Equations (2), (4), (5), and (6), the following expression is obtained:

$$\tilde{x}_N = \frac{\sum_{\forall s_n}\sum_{s_{n-1}(s_n)} x(s_{n-1}, s_n) P(y_{n-1}, s_{n-1}) P(y_n \mid x(s_{n-1}, s_n))}{\sum_{\forall s_n}\sum_{s_{n-1}(s_n)} P(y_{n-1}, s_{n-1}) P(y_n \mid x(s_{n-1}, s_n))} \quad \text{Equation 7}$$

That is, the soft feedback is computed by averaging the transmit symbol over all branches leading to all states at time n. The a priori probability $P(y_n|x)$ in Equation (9), where $x=x(s_{n-1},s_n)$, can be given as (assuming that ISI and noise are Gaussian)

$$P(y_n \mid x) = \frac{1}{\sqrt{\pi/\gamma}} e^{-\gamma|y_n - x|^2} \quad \text{Equation 8}$$

where $\gamma$ is the signal to ISI-plus-noise ratio.

Compared to the Viterbi algorithm, the above known optimal MAP algorithm is more complicated in many ways. First, it requires knowledge of $\gamma$. Second, since computations are not done in the logarithmic domain, multiplications and exponentiations are required. Furthermore, the MAP algorithm requires more memory for metric storage than the Viterbi algorithm.

B. Simplified Soft Decision Technique

Figure 2:
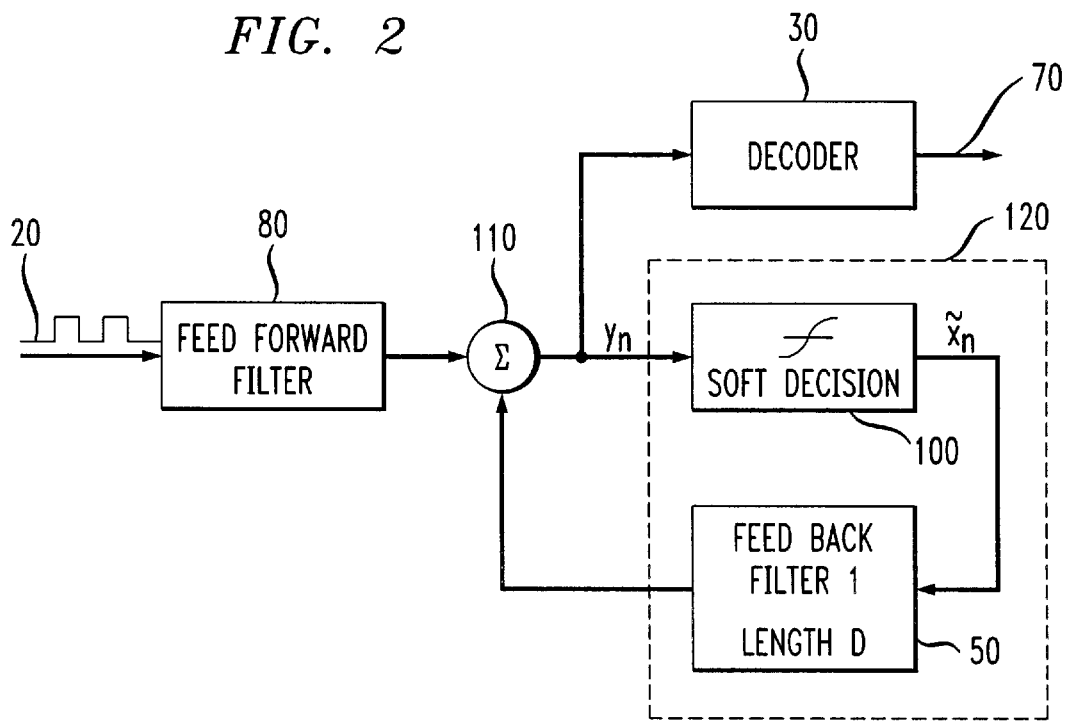
FIG. 2 illustrates a decoder system constructed according to a first illustrative embodiment of the invention using an enhanced soft decision rule.

The first illustrative embodiment of the invention, generally illustrated in FIG. 2, advantageously employs a streamlined technique for soft decision feedback which avoids these complications in the art. Incoming data signals 20, which can be wireless cellular telephone or other signals, arrive at feedforward filter (FFF) 80 with F taps, which applies digital filtering to cancel the effects of channel corruption, as known in the art. The data signals 20 so treated are then passed into summation part 110, where they are combined with feedback and sent to decision feedback equalizer (DFE) 120. DFE 120 contains soft decision unit 100 for processing data according to the enhanced soft decision metric described below. The processed data are finally sent to error correction decoder 30 for output. Error correction decoder 30 uses a standard Viterbi algorithm to correct remaining errors in the data and output the decoded output 70.

Unlike the prior art, when data arrives at soft decision unit 100 the simplifying assumption is made that the soft feedback $\tilde{x}_n$ is a function only of the current observation $y_n$ (that is, the currently soft-decided and fed back signal which is being transmitted to decoder 30), rather than a full traversal of historical states. Thus, instead of Equation (2), the estimate is:

$$\tilde{x}_n = E(x_n \mid y_n) \sum_{\forall x_n} x_n P(x_n \mid y_n) \quad \text{Equation 9}$$

and instead of Equations (3) and (4), $$P(x_n \mid y_n) = \frac{P(x_n, y_n)}{P(y_n)} = \frac{P(y_n \mid x_n)P(x_n)}{\sum_{\forall x_n} P(y_n \mid x_n)P(x_n)} \quad \text{Equation 10}$$

Using Equations (8), (9), and (10), and assuming that $$x_n \pm \frac{1}{\sqrt{2}} \pm \frac{j}{\sqrt{2}}$$

(i.e., QPSK), the following soft decision function is obtained:

$$\tilde{x}_n = f(y_n) = \frac{1}{\sqrt{2}}\left(\tanh\left(\sqrt{2}\,\gamma\,\text{Re}(y_n)\right) + j\tanh\left(\sqrt{2}\,\gamma\,\text{Im}(y_n)\right)\right) \quad \text{Equation 11}$$

In the first illustrative embodiment, the soft feedback is obtained by passing the real part and the imaginary part of the output of DFE 120 through the soft decision unit 100 which calculates the hyperbolic tangent function of Equation 11. In practice, soft decision unit 100 may be implemented in the form of lookup tables, in dedicated ROM, in software or otherwise. The resulting soft decision on current data value $\tilde{x}_n$ is then passed back through feedback filter 50, for combination with newly arriving data in data signals 20 but delayed by delay D. The effect of this feedback combination is to cancel, to a good degree, the effects of ISI in past received data, reflected in the area above time frame of width B in FIG. 15(b).

The implementation of the first illustrative embodiment of the invention still requires knowledge of the signal to ISI-plus-noise ratio $\gamma$. However, it will be shown that an appropriate fixed value of $\gamma$ can be chosen without greatly affecting the achievable performance of the equalization system and method of the invention using enhanced soft-feedback DFE.

C. Performance Comparison

Given the significant difference in complexity between the optimum soft feedback approach based on Lee's known algorithm and the system and method of the invention based on a streamlined soft decision technique, one may wonder how these methods perform compared to one another. The inventors have evaluated this through computer simulations of both methods as applied to joint coding and equalization of fading dispersive channels.

In that comparison the following details are assumed:

Transmission Format: QPSK using a square-root Nyquist filter with a 0.30% roll-off at both the transmitter and receiver ends. An information data packet contains 800 QPSK symbols excluding overhead.

Channel Model: An N-path channel model is used, where the N paths are equal-power, uniformly spaced by an interval T (T being the symbol period), and independently Rayleigh fading. N=2 and N=6 are assumed, so the maximum channel dispersion is 5T (for 6 T-spaced paths). The channel is assumed to be stationary during the duration of each data packet (i.e., quasi-static fading).

Coding Scheme: A rate ½ convolutional code with a constraint length of 6 is used. The generator polynominals are $g_1(x)=x^5+x^3+x+1$ and $g_2(x)=x^5+x^4+x^3+x^2+1$. This code has a minimum distance of 8. A 32-state Viterbi decoder is employed.

DFE: A DFE with 8 (contiguous) symbol-spaced feedforward taps and 5 feedback taps is used. Training is assumed to be perfect, i.e., optimum tap gains are obtained numerically by solving the minimum mean-square error (MMSE) equations.

Timing Estimation: Symbol and sequence timing are adapted using known channel-estimation-based methods (see S. Ariyavisitakul and L. J. Greenstein, "Reduced-Complexity Equalization Techniques for Broadband Wireless Channels," IEEE Journal of Selected Areas in Communications, vol. 15, pp. 5–15, January 1997, the disclosure of which is incorporated herein by reference). This method finds a symbol timing τ (assuming an oversampled received signal) and a sequence timing d(O) that maximizes the following output signal-to-noise ratio (SNR) index:

$$\Upsilon_0 = \frac{|\bar{h}_{d(0)}(\tau)|^2}{G_{d(0)}} \qquad \text{Equation 12}$$

where $G_{d(0)}=$ $$G_{d(0)} = \sum_{k=-K_1}^{d(0)-1} |h_k(\tau)|^2 + 2N_0$$

is the estimated precursor power plus noise power, $\{h_k(\tau)\}$ are the estimated channel impulse response at symbol timing τ, and $2N_0$ is the estimated noise power. All channel and noise power estimates are assumed to be perfect. The received signal is oversampled at 4 times the symbol rate.

Antenna Diversity: When receiver antenna diversity is used, a separate feedforward filter (8 taps) on each branch is assumed, and a common feedback filter placed after combining (see FIG. 4). The symbol and sequence timings are adjusted independently on each branch, but all filter tap gains are jointly optimized.

Choice of γ: For the optimum soft feedback approach based on Lee's algorithm, the actual value of γ given by the MMSE after tap gain computations is used. This is done to obtain the best possible soft feedback performance as a benchmark. When using the calculation based on Equation (11), a fixed value of γ is used.

Figure 5:
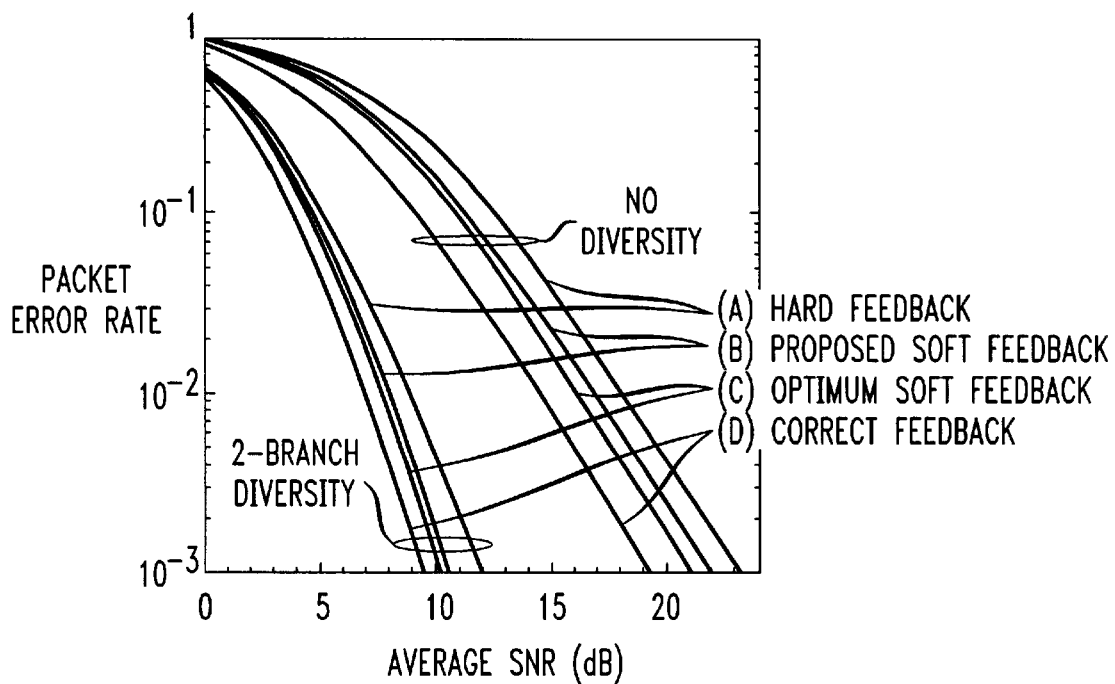
FIG. 5 illustrates a coded PER performance of MMSE-DFE using different feedback techniques.
Figure 6:
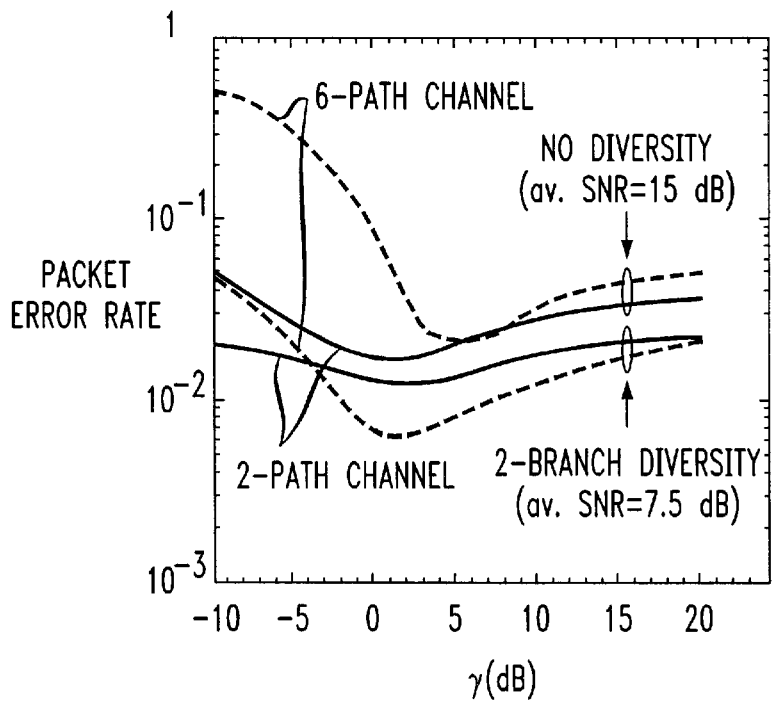
FIG. 6 illustrates the performance versus choice of $\gamma$ for the soft decision technique of the invention.

Since the first illustrative embodiment does not incorporate tentative hard decision feedback, the use of delayed feedback from the receiver structure is temporarily excluded. FIG. 5 shows the coded packet error rate (PER) performances of the two soft-feedback DFE techniques in the 2-path channel. The performances are given as a function of the average input SNR (the average is over Rayleigh fading). FIG. 6 shows results for the 6-path channel. Both figures show coded performances of DFE, using correct feedback (ideal case) and hard feedback. The values of γ (in dB) preferably used in the soft decision technique of the invention are: γ=5 dB for no diversity, and γ=0 dB for 2-branch diversity. These values are not necessarily the optimum fixed values, as can be seen from the performance versus choice of γ shown in FIG. 5.

Figure 7:
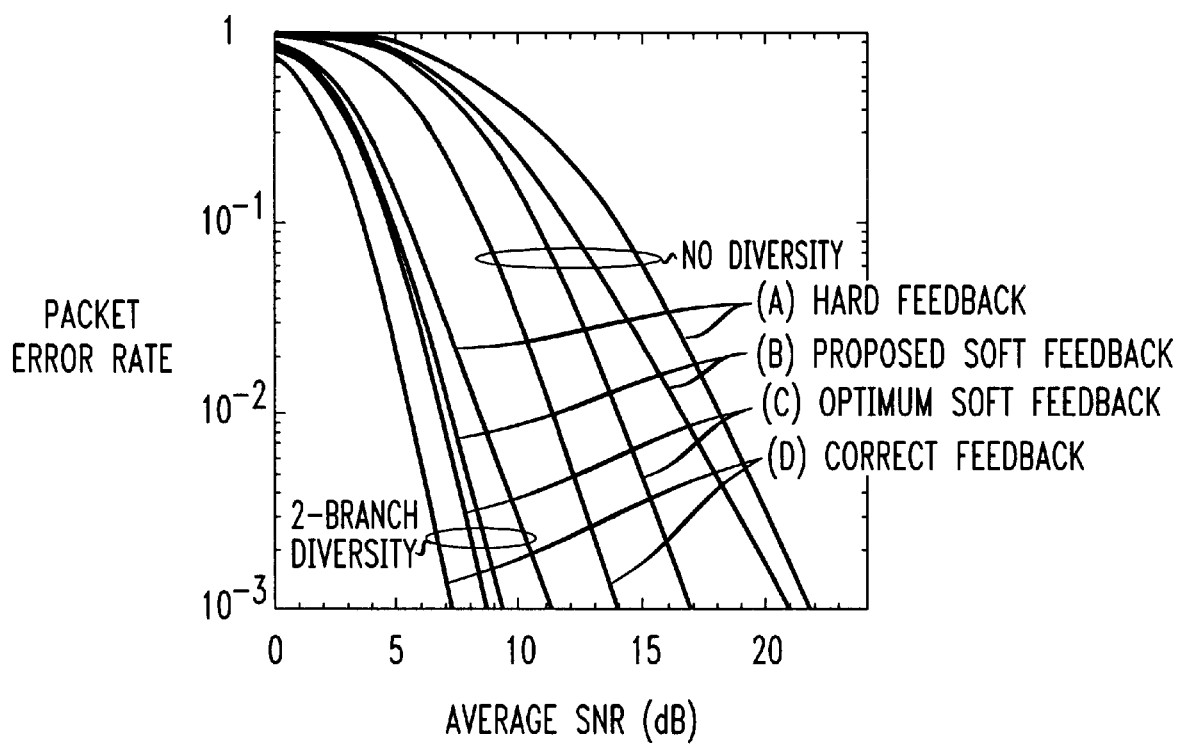
FIG. 7 illustrates a coded PER performance of MMSE-DFE using different feedback techniques.
Figure 8A:
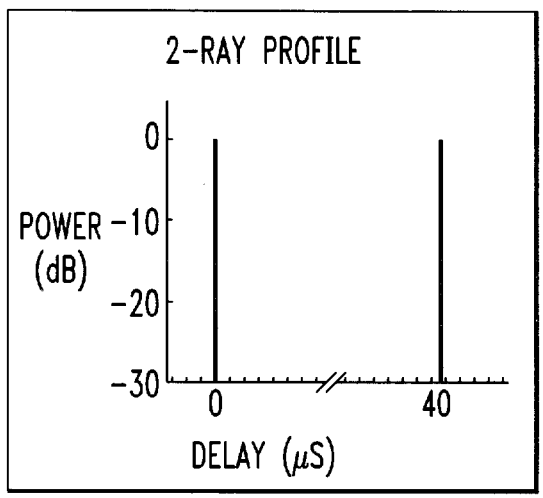
FIGS. 8(*a*)–(*d*) illustrate multipath delay profiles.
Figure 8B:
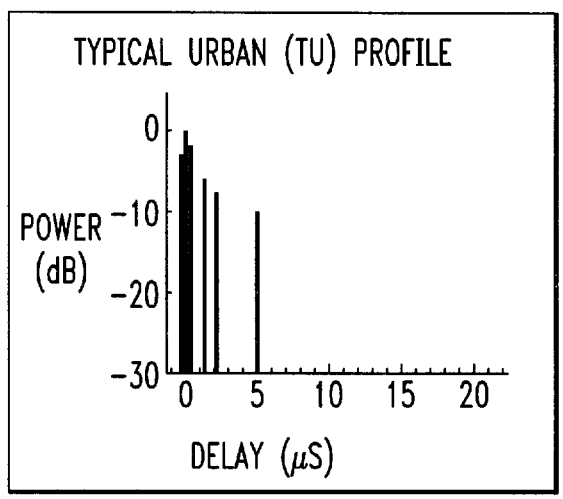
Figure 8C:
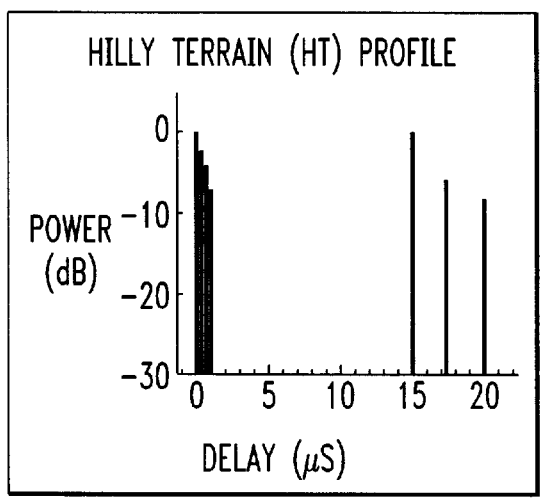
Figure 8D:
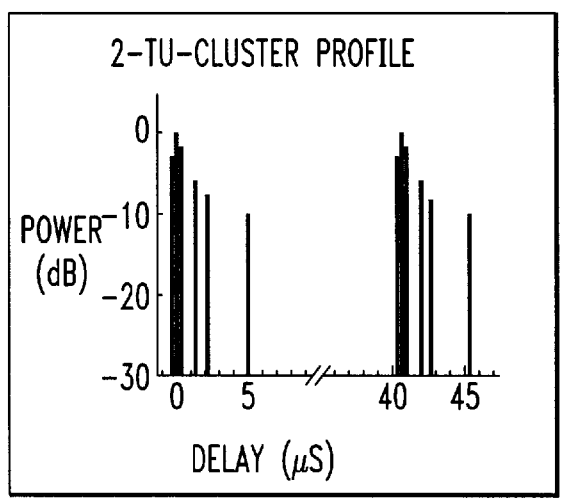

It can be seen from FIGS. 5 and 7 that the performance differences between different feedback approaches become larger proceeding from the 2-path channel to the 6-path channel. This is due to the fact that the 6-path channel requires more past-symbol ISI cancellation than the 2-path channel.

Although the enhanced soft feedback technique used in the invention does not perform quite as well as the optimum soft-feedback method when there is no diversity (especially for the 6-path channel), it performs well in the 2-branch diversity case. In that instance the invention comes within less than 0.5 dB of the optimum soft feedback method in terms of the required SNR to achieve 1% PER. These results are promising, since the use of a receiver with antenna diversity is of significant practical interest, since the required SNR for a receiver without diversity is generally too high to be useful.

II. Second Illustrative Embodiment of the Invention

Figure 3:
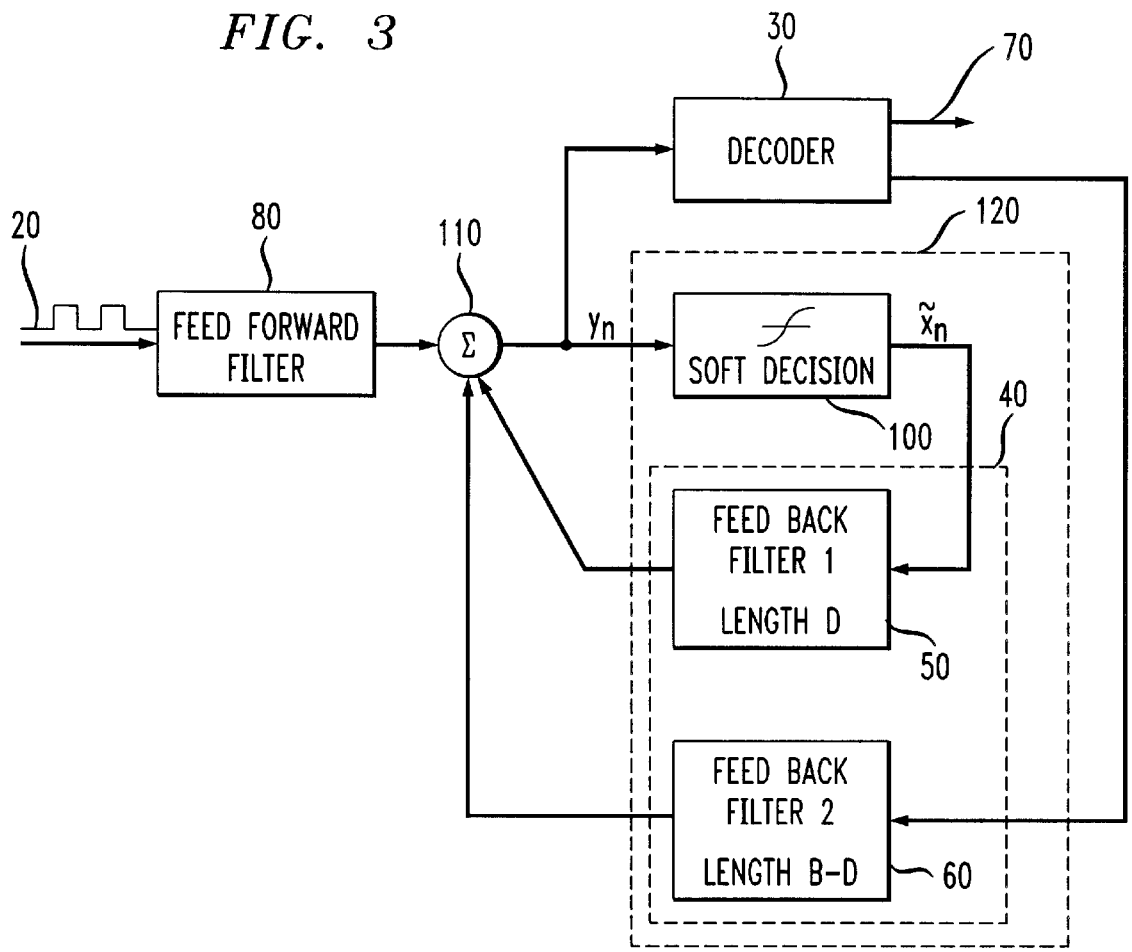
FIG. 3 illustrates a decoder system constructed according to a second illustrative embodiment of the invention using an enhanced soft decision rule and feedback filtering of tentative hard decisions.

The second illustrative embodiment of the system and method of the invention combines a delayed hard feedback with the enhanced soft decision technique described above. As illustrated in FIG. 3, error correction decoder 30 again uses a standard Viterbi algorithm, and receives output $y_n$ of the DFE 120. DFE 120 in this embodiment consists of feedback filter 40 implemented as two transversal filters (FBF$_1$ 50 0 and FBE$_2$ 60) with a total of B taps. Letting $x_n$ denote the nth transmitted data symbol, the output of the DFE 120 can be written as $$y_n = \sum_{q=0}^{F-1} a_q r_{n+d(q)} - \sum_{nt=1}^{D} b_m \tilde{x}_{n-m} - \sum_{m=D+1}^{B} b_m \hat{x}_{n-m} \qquad \text{Equation 13}$$

where $\{a_q\}$ and $\{b_m\}$ are the feedforward and feedback filter tap gains; $r_n$ is the $n^{th}$ received signal sample; $\tilde{x}_n$ is the output of soft decision device 100 and $\hat{x}_n$ is the tentative (hard) decision provided by the decoder 30 with delay D. The delay of each feedforward tap is denoted by d(q), for q=0, 1, . . . , F−1, which need not be contiguous integers. They can be made variable to provide improved performance in sparsely distributed multipath channels (see S. Ariyavisitakul, N. R. Sollenberger and L. J. Greenstein, "Tap-Selectable Decision Feedback Equalization," IEEE ICC '97, Montreal, Canada, June 1997, pp. 1521–1526). The sequence timing of the receiver is defined by the delay of the first feedforward tap d(0).

The received signal $r_n$ can be expressed as $$r_n = \sum_{k=-K_1}^{K_2} h_k x_{n-k} + \eta_n \qquad \text{Equation 14}$$

where $h_k$ is the $k^{th}$ sample of the channel impulse response, and $\eta^n$ is the $n^{th}$ sample of additive white Gaussian noise with single-sided power density of $N_0$. The channel has a finite response such that $h_k=0$ for $k<-K_1$ and $k>K_2$.

It is assumed that the length of the feedback filter 50 is at least as large as the maximum span of the channel dispersion. This is to guarantee that ISI from past symbols can always be canceled by the feedback filter 50.

Figure 15A:
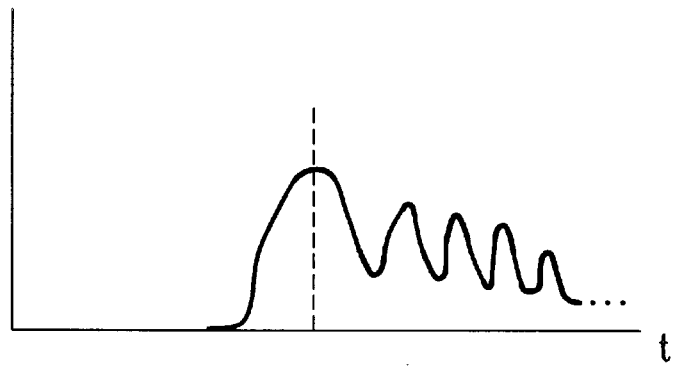
FIGS. 15(*a*)–15(*c*) illustrate channel impulse response generally, and output signals generated by a receiver constructed with soft feedback equalization, and combined soft/hard feedback equalization, according to the invention.
Figure 15B:
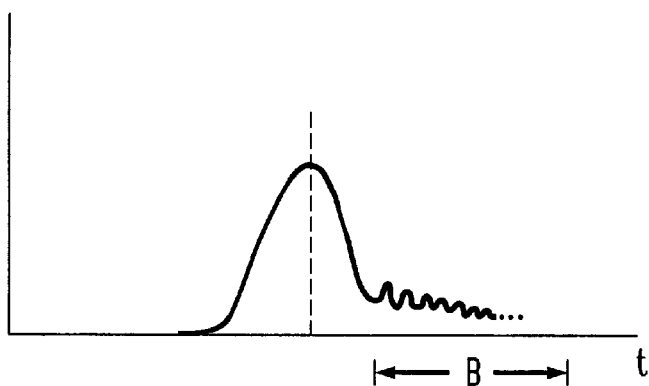
Figure 15C:
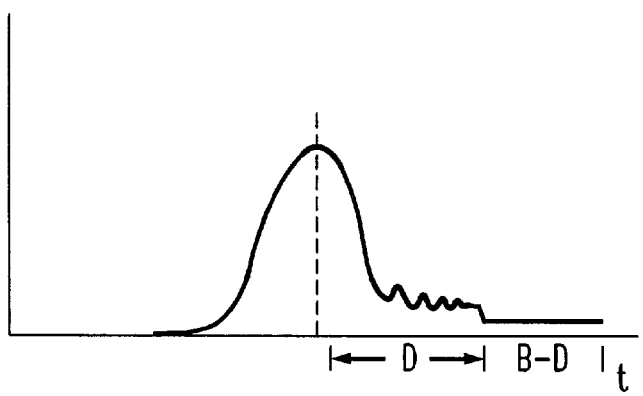

As illustrated in FIG. 15(b), the ISI from past symbols $x_{n-1}, x_{n-2}, \ldots, x_{n-D}$ (area above time frame of width B) is not completely canceled because FBF$_1$ 50 uses the output of soft decision unit 100, which is not completely optimal. However, the addition of tentative hard decision feedback (FIG. 15(c)) minimizes the effect of residual ISI (FIG. 15(b)) from these symbols, in the second illustrative embodiment of the invention. FBF$_2$ 60 can perform perfect cancellation of ISI from past symbols $x_{n-D-1}, x_{n-D-2}, \ldots, x_{n-B}$, (area above time frame of width B-D in FIG. 15(c)) given that the tentative decisions provided by the decoder 30 are reliable. The larger the value of D is made, the more reliable these decisions are. Combining these effects yields perfect cancellation of ISI from past symbols (hard feedback, B-D) plus good cancellation of future symbol IST (soft feedback, D), as show in FIG. 15(c).

However, increasing D too much in the pursuit of increased reliability (i.e., to widen time frame B) would increase the length of FBF$_1$ 50, curtailing the ability of the soft decision unit 100 to make accurate determinations and resulting in excessive residual ISI. Soft decision accuracy therefore acts as a counteracting factor to enlarging D. From a hardware implementation viewpoint, it is also desirable to reduce the length of $FBF_1$ 50 so that the number of multiply operations needed is minimized ($FBF_2$ 60 is multiplication-free because the convolution of hard-decided QPSK symbols with the filter tap gains can be implemented using adders).

A Viterbi decoder such as typically implemented in decoder 30 generally requires a decoding delay of at least 2K to 3K to give reliable final output, where K is the constraint length of the convolutional code. In the implementation of the invention, the inventors have found an appropriate value of the tentative decoding delay D to be around D=K, as will be seen from results below.

The second illustrative embodiment of the invention is particularly well applied to broadband wireless channels with dispersions ranging up to several tens of the symbol period. Here, the receiver incorporating the invention is combined with a low-complexity DFE concept as known in the art, which employs a small number of feedforward filter taps, and a long but training-free feedback filter. The previously described radio link characteristics are continued for the purpose of performance analysis, with exceptions described below.

A. Radio Link Model for Broadband

Wireless Applications

Transmission Bit Rate: 2 Mbits/s. The symbol period $\tau$ is 1 $\mu$s using QPSK.

Multipath Delay Profiles: FIG. 6 shows the delay profiles used to test the associated receiver. The 2-ray profile consists of 2 equal-power paths, separated by 40.5 $\mu$s (this number is arbitrary; only the fact that it is a large number and not an integer is significant). The Typical Urban (TU) and Hilly Terrain (HT) profiles are similar to those specified by GSM, R. Steele, Ed., "Mobile Radio Communications" IEEE Press, 1992, the disclosure of which is incorporated by reference. The 2-TU-Cluster profile is obtained by convolving the TU profile with the 2-ray profile. This profile is used in the art to represent a hilly terrain environment with intensive local scattering, resulting in a dispersive first-arrival multipath cluster. All paths in the above profiles are assumed to be independently Rayleigh fading.

Tap-Selectable DEE: The low-complexity broadband DEE consists of a feedforward filter with 8 taps (per diversity branch) and a feedback filter with 50 taps. A contiguous/floating feedforward tap assignment structure is used, where the first 4 taps are symbol-spaced and the last 4 taps are sparsely assigned using a known channel-estimation-based tap assignment algorithm called UISI as known in the art. The UISI (based on an "Uncorrelated ISI" criterion) algorithm selects the F tap delays (F is the number of floating taps in this case) with the largest tap SNR: $|h_{d(q)}|^2/G_{d(q)}$, where in this case, d(q) must be selected from any possible delays greater than d(0)+3, because of the mixed contiguous/floating tap structure assumed here. The tap selectable structure is significant for sparsely distributed multipath profiles, such as the HT and the 2-TU-Cluster profiles.

Similar to timing recovery, independent tap assignment is done for each diversity branch. The estimated noise power used in both processes is set to a fixed value of 0.001 (regardless of the actual input SNR), i.e., 30 dB below the received signal power level assuming perfect adaptive gain control (AGC).

Channel Estimation and DEFE Training: Channel estimation is required in the second illustrative embodiment of the invention for more than one purpose: (i) timing recovery, (ii) adaptive tap assignment, and (iii) presetting the feedback filter of the low-complexity DFE as known in the art. Initial training of all the feedforward taps is done using a least mean-square (LMS) algorithm with an optimum step size (see S. Haykin, "Adaptive Filter Theory", Englewood Cliffs, N.J.: Prentice-Hall, 1991, the disclosure of which is incorporated herein by reference). In the decision-directed mode, both the feedforward and the feedback taps are jointly adapted (to provide a channel tracking capability) using the same LMS algorithm but with a smaller step size. Channel estimation and training are done using a sync word included in each data packet, as known in the art.

Packet Overhead: A data packet contains sync word of length 126 and coded payload data of length 800, all in units of QPSK symbols. The sync word includes 2 periods of a pseudo-noise (PN) sequence of length 63 and is binary-modulated at the QPSK symbol rate.

Figure 4:
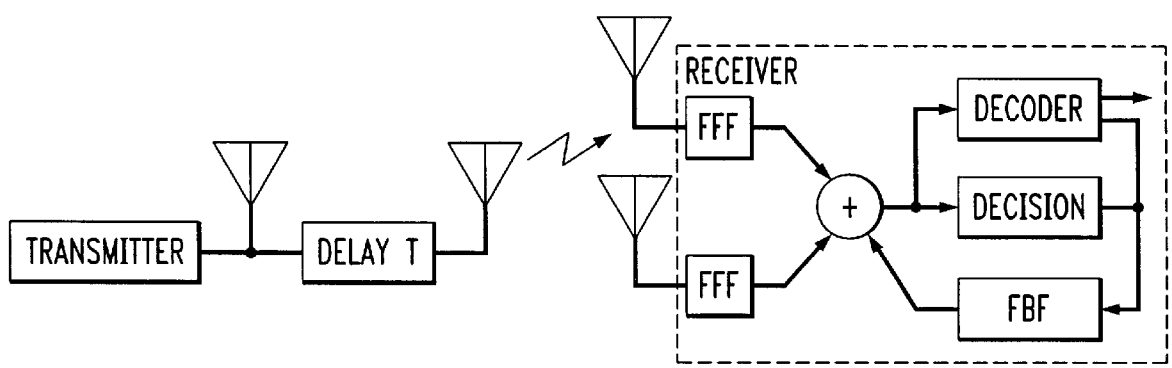
FIG. 4 illustrates a basic transmitter-receiver structure with diversity.

Transmitter Diversity: Since flat fading is often a performance-limiting case in wireless links using DFE as known in the art, in one implementation the invention may use transmitter diversity to eliminate flat fading characteristics. The basic transmitter-receiver structure is shown in FIG. 4. The transmitter uses 2 diversity antennas with a delay of 1 symbol unit between both antennas to create an artificial multipath effect, i.e., a flat fading signal will be received as if the channel were a 2-path fading channel similar to the model used in FIG. 5.

Choice of $\gamma$ and D: Since all the results to be shown include receiver diversity, $\gamma=0$ dB is used as the SNR parameter in the soft decision function. A tentative decoding delay of D=5 is used. The sensitivity to the choice of D will also be discussed.

B. Basic Performance in Quasi-Static Fading

The above radio link model includes a number of unconventional elements, such as tap-selectable DFE and transmitter diversity. To show why these techniques are needed, results are presented comparing performance with and without each element. Performance of DFE with different feedback approaches is also presented: (i) the soft/delayed-feedback DFE (S/D-DFE)of the invention, (ii) the ideal correct-feedback DFE (C-DFE), (iii) hard-feedback DFE (H-DFE), and (iv) another reference scheme, called hard/delayed-feedback DFE (H/D-DFE), which operates somewhat similar to the invention, but uses hard decisions before decoding in $FBF_1$. The C-DFE and H-DFE use correct and hard decisions to update tap gains in the decision-directed mode. For S/D-DFF and H/D-DFE, the use of tentative decisions provided by the decoder with delay D is assumed (this latency may affect the channel tracking performance of the proposed S/D-DFE; however, as shown below, this technique does perform quite well even in fast fading).

Figure 9:
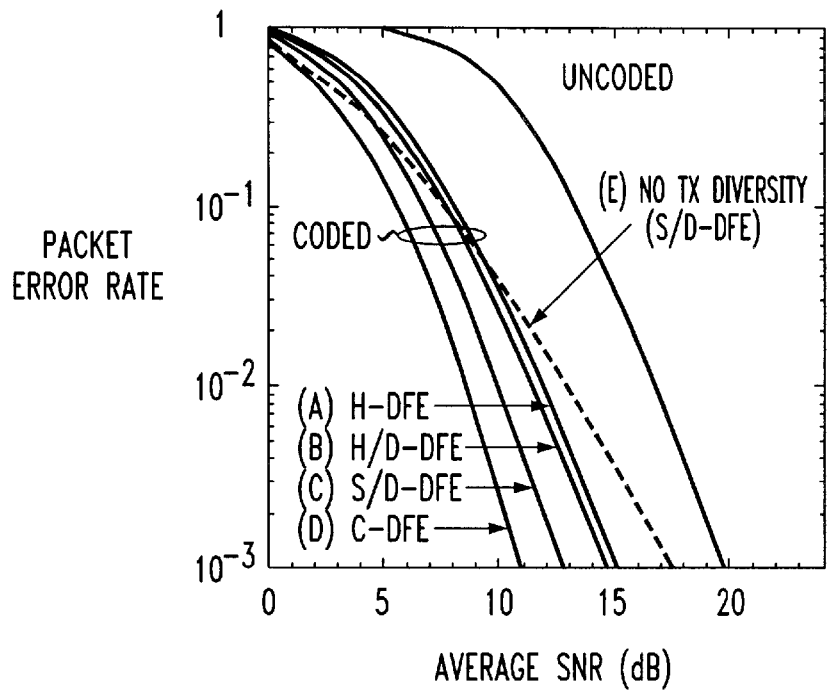
FIG. 9 illustrates PER performance of different DFE schemes including the invention in flat fading.

FIG. 9 shows the coded PER performance of the above-mentioned DFE schemes in a quasi-static flat fading channel. Because of the use of transmitter diversity, this channel behaves as if it were the 2-path fading channel used in FIG. 5. Unlike the results in FIG. 5, however, the results shown here include the effect of noisy channel estimates and imperfect LMS training. In addition, all the results are obtained from fixed point simulations that match a specific prototype design. However, the effect of fixed-point arithmetic on the PER performance was found by the inventors to be negligible.

These receiver imperfections cause a degradation in required SNR at 1% PER of about 2 to 3 dB (this is also true for other delay profiles). Since the channel dispersion lasts only 1 symbol period in this case, the use of delayed feedback is actually not needed. The slight PER improvement given by H/D-DFE over H-DFE is due to the use of more reliable delayed decisions to update tap gains in the decision-directed mode. Comparing H/D-DFE to the invention, the use of enhanced soft feedback is found to provide an improvement of 1.5 dB in required SNR at 1% PER. Performance differences between other schemes are summarized below (Table 1).

Figure 10:
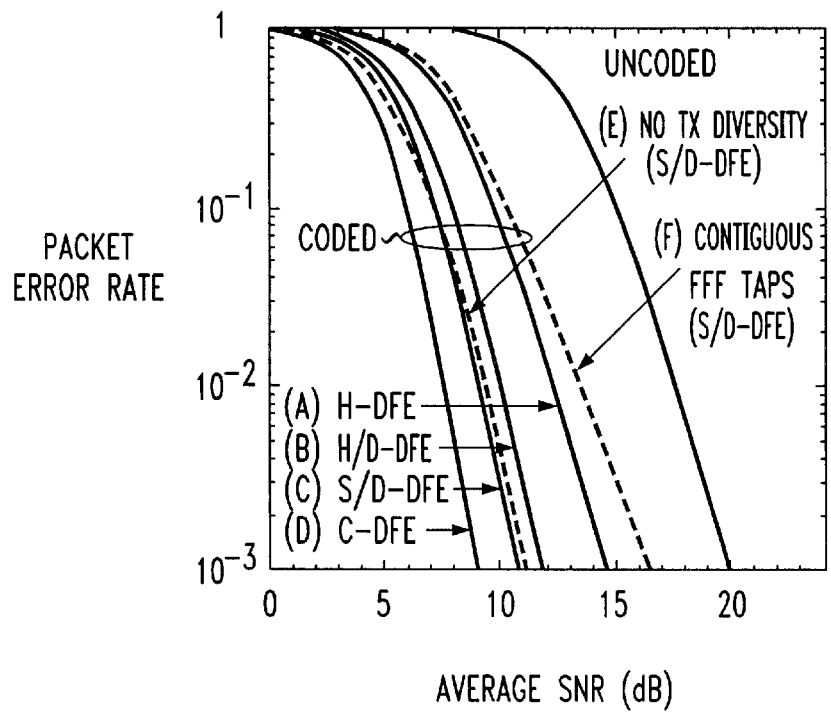
FIG. 10 illustrates PER performance of different DFE schemes including the invention for the 2-TU-Cluster profile.

FIG. 10 shows similar results for the 2-TU-Cluster profile, which reveal a large performance difference between H-DFE and H/D-DFE, due to the large channel dispersion. In fact, the performance of H/D-DFE is closer to the performance of the invention than to the performance of H-DFE in this case, indicating a greater role of delayed feedback in improving performance for this channel.

FIGS. 9 and 10 also provide, for the invention, a comparison of performance with and without transmitter diversity (curve (c) and curve (e) in both figures), and a comparison of performance with and without adaptive feedforward tap assignment (curve (c) and curve (f) in FIG. 10 only). It can be seen in FIG. 9 that transmitter diversity improves performance in flat fading by as much as 3 dB, at 1% PER. The smaller improvement for the 2-TU-cluster profile in FIG. 10 is due to the diminishing returns of multipath diversity, and also to the limited number of feedforward taps for exploiting multipath energy. However, the receiver already performs well without transmitter diversity for the 2-TU-Cluster profile. On the other hand, adaptive feedforward tap assignment is needed for this channel. The comparison in FIG. 10 indicates that it gives an improvement at 1% PER of 4.5 dB over a contiguous-tap DFE.

Table 1 summarizes the coded performance of the invention and other DFE schemes for various delay profiles. The performance is given in terms of the required SNR at 1% PER. Quasi-static fading and the use of both transmitter diversity and adaptive tap assignment are assumed in all the results. Uncoded performance (assuming a conventional hard-feedback DFE) is shown so that the coding gain given by each scheme can be determined.

TABLE 1

REQUIRED SNR (IN dB) AT 1% PER FOR DIFFERENT DFE SCHEMES
Coded

| Channel | C-DFE | Invention | H/D-DFE | H-DFE | Uncoded |
| --- | --- | --- | --- | --- | --- |
| Flat-Fading | 8.6 | 9.8 | 11.3 | 11.8 | 16.6 |
| 2-Ray Profile | 7.9 | 9.2 | 9.9 | 11.6 | 16.8 |
| TU Profile | 7.5 | 9.5 | 11.0 | 11.3 | 15.8 |
| HT Profile | 7.7 | 9.0 | 10.0 | 12.1 | 16.7 |
| 2-TU-Cluster Profile | 7.6 | 9.1 | 10.1 | 12.4 | 17.6 |

It can be seen that the invention (S/D-DFE approach) performs within only 1 to 2 dB of the ideal C-DFE performance. The system and method of the invention likewise outperforms conventional H-DFE by 2 dB (flat fading) to 3.3 dB (2-TU-Cluster).

In general, for a frequency reuse radio system assuming a path loss exponent of 4 or greater, the coding gain must be larger than 6 dB to justify the use of rate ½ coding. Otherwise, doubling the frequency reuse factor without coding would provide better PER performance while achieving the same spectrum efficiency (see L. F. Chang and S. Ariyavisitakul, "Performance of Convolutional Codes with Interleaving in the Interference Limited Rayleigh Fading Channel," IEEE VTC'91, St. Louis, Mo., May 1991, pp. 812–816, the disclosure of which is incorporated herein by reference). The H-DFE scheme fails to meet this criterion because it provides a coding gain of only 4.5 to 5.2 dB. The invention, on the other hand, gives a coding gain of 6.8 to 8.5 dB. Furthermore, the invention requires an SNR of only about 10 dB to guarantee a PER of 1% for all profiles (flat fading is the worst case). This means that the system may require a reuse factor of only 4 or less. (See L. C. Wang, K. Chawla and L. J. Greenstein, "Performance Studies of Narrow-Beam Trisecor Cellular Systems," submitted to International Journal of Wireless Information Networks, March 1997, the disclosure of which is incorporated herein by reference).

Comparing H/D-DFE with H-DFE, the use of delayed feedback alone is found to give a significant improvement (of about 2 dB) in channels with large dispersions: 2-Ray, HT, and 2-TU-Cluster profiles, although it gives little improvement for flat fading and the TU profile.

Figure 11:
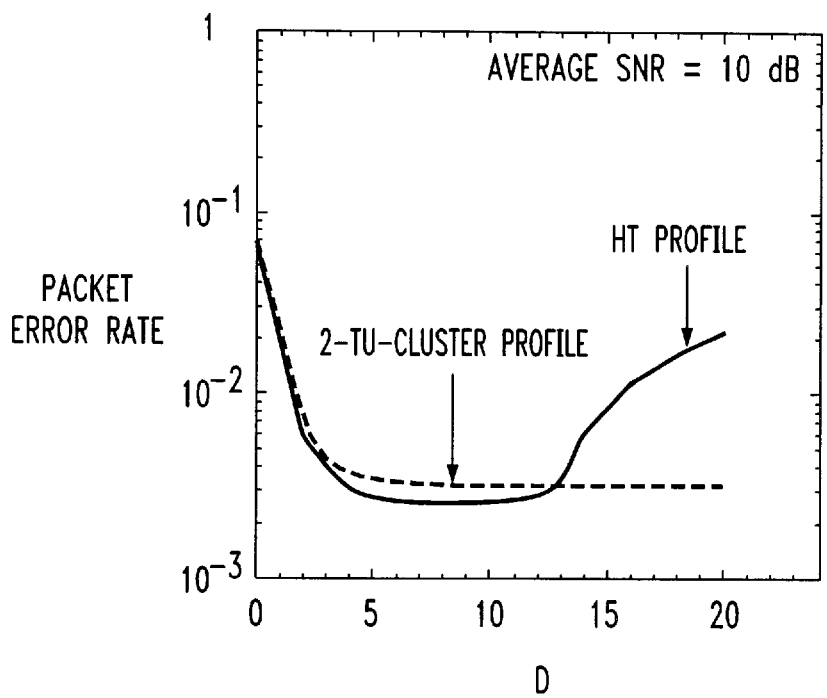
FIG. 11 illustrates performance versus choice of D for soft decision delayed feedback equalization according to the invention (S/D-DFE)

FIG. 11 shows the performance versus choice of D using the D-DFE scheme of the invention. D=0 corresponds to the H-DFE case. It can be seen that the tentative decoding delay D need not be larger than the constraint length K (K=6 in the case of the preferred embodiment) to achieve near-optimum performance. In fact, it can be as low as D=4 for all the profiles tested. As mentioned earlier, increasing D can have an adverse effect on performance if the extended use of soft feedback results in excessive residual ISI. This is observed in the results for the HT profile, i.e., as D approaches D=15, which corresponds to the delay where the ISI due to multipath in the second cluster (see FIGS. 8($a$)–8($d$)) needs to be mitigated. The same effect also occurs for the 2-TU-Cluster profiles but at a much larger D.

C. Fast Fading Performance

Figure 12:
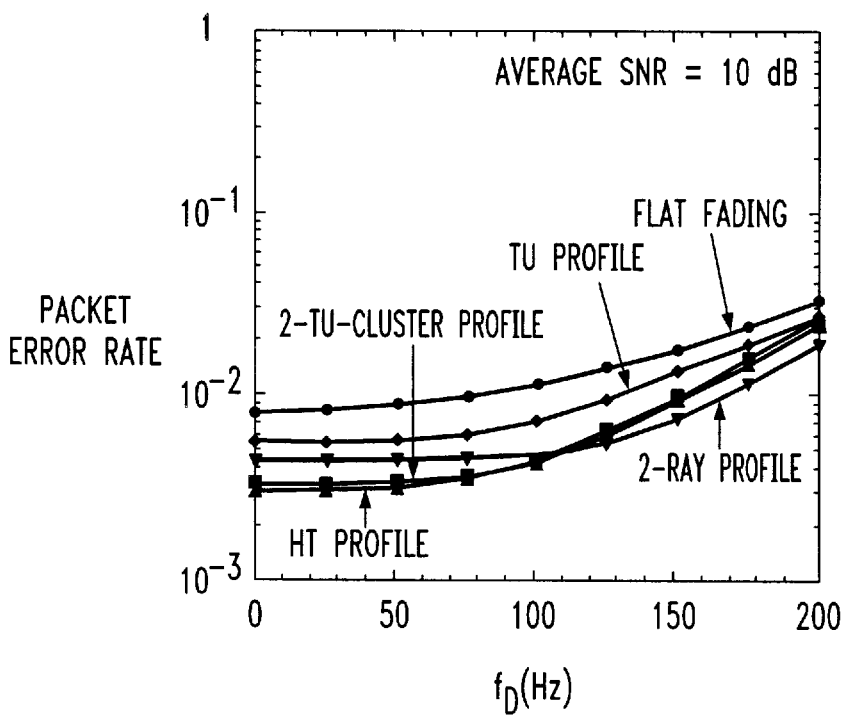
FIG. 12 illustrates the performance versus fading rate $f_D$ for a receiver constructed according to the invention.

The preceding results assume quasi-static fading. FIG. 12 shows the coded performance of the invention as a function of the Doppler frequency $f_n$, assuming an average SNR of 10 dB (to guarantee 1% PER for all profiles in quasi-static fading). Time-correlated fading within each packet was generated using Jakes' method (see W. C. Jakes, Jr., Ed., "Microwave Mobile Communications", New York: Wiley, 1974, the disclosure of which is incorporated herein by reference). Continuous tap updates are assumed during data detection using an LMS algorithm and tentative decisions from the decoder 30.

Figure 13:
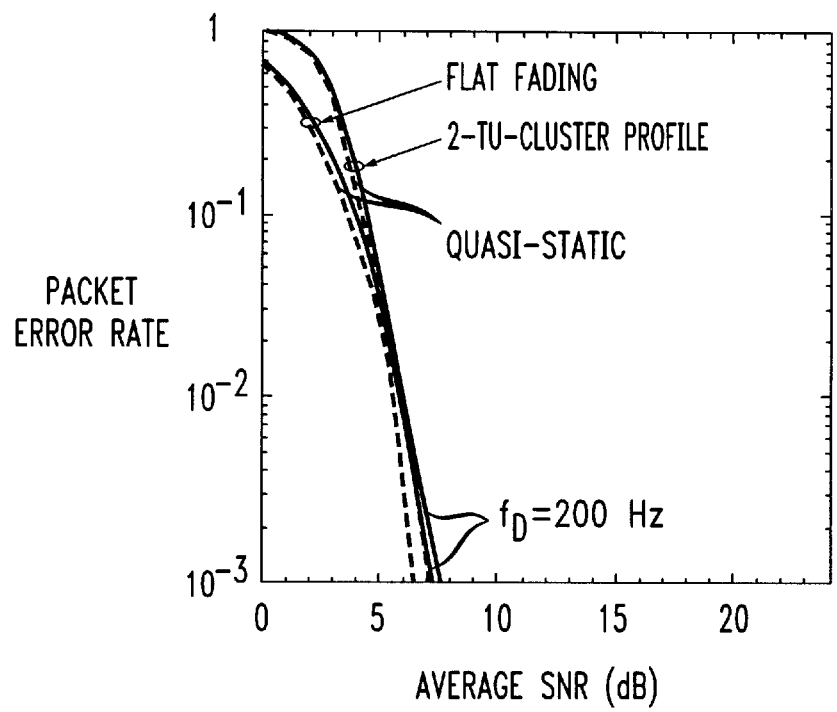
FIG. 13 illustrates the effect of packet length on performance of a receiver constructed according to the invention.

Despite the generally slow tracking capability due to the large number of taps, and the latency caused by tentative decoding delay, FIG. 12 shows that the invention tolerates channel variations well. At $f_D$=200 Hz (corresponding to a speed of 68 mi/hr at a carrier frequency of 2 GHz), the PER is only about 2% to 3% for the given SNR of 10 dB. FIG. 13 shows the effect of packet length on the performance of the invention, where the packet length is the number of payload QPSK symbols included in each data packet (packet length of 800 is assumed in all other results in this comparison). Results assuming no tap updates after training are shown (curve(c)) to demonstrate both how significant channel tracking is, and how well a wireless receiver configured according to the invention performs in fast fading.

Figure 14:
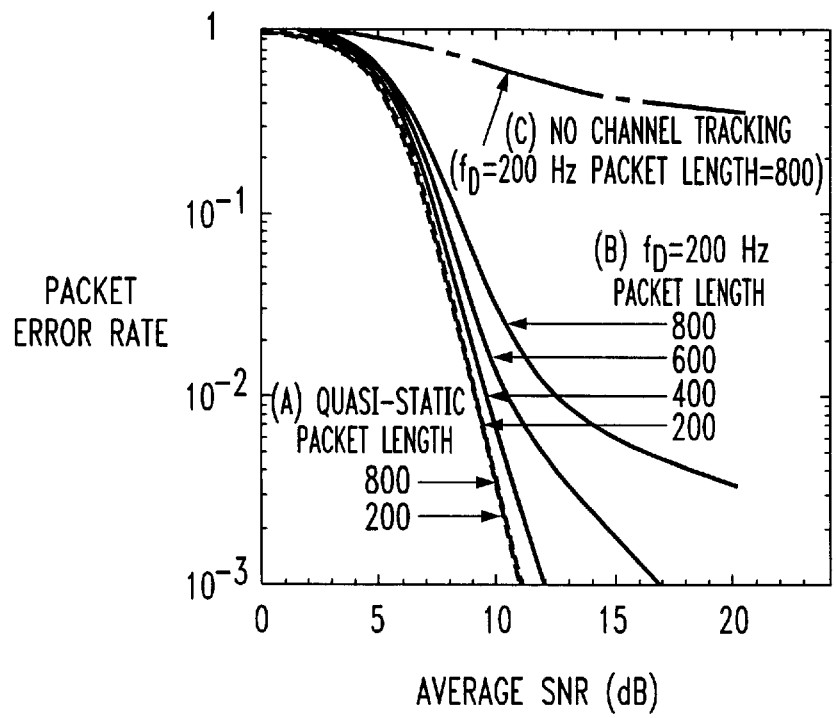
FIG. 14 illustrates the performance of a receiver constructed according to the invention with 4-branch diversity.

The effect of fast fading becomes less severe when higher-order diversity is considered. FIG. 14 shows performance results assuming 4-branch receiver diversity. Comparing the results for the 2-TU-cluster profile with those assuming a packet length of 800 in FIG. 13, a much smaller degradation due to fast fading in the 4-branch diversity case is seen. Furthermore, the receiver requires an SNR of only about 6 dB to achieve 1% PER (even for $f_D$=200 Hz) in all the profiles tested.

The foregoing description of the system and method for combined coding and broadband equalization of the invention is illustrative, and variations in construction and implementation will occur to persons skilled on the art. The scope of the invention is accordingly intended to be limited only by the following claims.

What is claimed is:

1. A method of processing a received signal, comprising the steps of:
   subjecting the received signal to a feedforward filter to compensate for channel noise, and producing a fedforward received signal;
   combining the fedforward received signal with a soft feedback signal into a combined signal;
   subjecting the combined signal to a soft decision metric to produce a soft output; and
   subjecting the soft output to a feedback filter to produce the soft feedback signal.

2. The method of claim 1, further comprising a step of decoding the combined output to produce a decoded output.

3. The method of claim 2, wherein the step of decoding comprises the step of decoding the convolutional code.

4. The method of claim 3, wherein the convolutional code has constraint length K, and D=K.

5. The method of claim 2, wherein the step of decoding comprises the step of decoding the combined signal using a Viterbi decoder.

6. The method of claim 1, wherein the feedback filter delays the soft feedback signal by a period D, and the soft feedback signal suppresses interference from symbols $x_{n-1}$, $x_{n-2}$, ... $x_{n-D}$.

7. The method of claim 1, wherein the received signal represents an information signal encoded using a convolutional code.

8. The method of claim 1, wherein the soft decision metric is computed as:

$$\tilde{x}_n = \frac{1}{\sqrt{2}}\left(\tanh\left(\sqrt{2}\,\gamma\,\text{Re}(y_n)\right) + j\tanh\left(\sqrt{2}\,\gamma\,\text{Im}(y_n)\right)\right),$$

where $\gamma$ is a received signal-to-noise ratio parameter and $y_n$ is the combined signal.

9. A system for processing a received signal, comprising:
   a feedforward filter, filtering the received signal to compensate for channel noise, and producing a fedforward received signal;
   a combining unit, connected to the feedforward filter, and combining the fedforward received signal and a soft feedback signal into a combined signal;
   a soft decision unit, connected to the combining unit, and receiving the fedforward received signal and subjecting the combined signal to a soft decision metric to produce a soft output; and
   a feedback filter, connected to the soft decision unit and to the combining unit, and receiving the soft output and outputting the soft feedback signal,
   the soft decision metric being computed as:

$$\tilde{x}_n = \frac{1}{\sqrt{2}}\left(\tanh\left(\sqrt{2}\,\gamma\,\text{Re}(y_n)\right) + j\tanh\left(\sqrt{2}\,\gamma\,\text{Im}(y_n)\right)\right),$$

where $\gamma$ is a received signal-to-noise ratio parameter and $y_n$ is the combined signal.

10. The system of claim 9, further comprising a decoding unit, connected to the combining unit, and receiving the combined signal and outputting a decoded output.

11. The system of claim 10, wherein the received signal represents an information signal encoded using a convolutional code, and the decoding unit comprises a convolutional decoder.

12. The system of claim 11, wherein the convolutional code has constraint length K, and D=K.

13. The system of claim 10, wherein the decoding unit comprises a Viterbi decoder.

14. The system of claim 9, wherein the feedback filter delays the soft feedback signal by a period D, and the soft feedback signal suppresses interference from symbols $x_{n-1}$, $x_{n-2}$, ... $x_{n-D}$.

15. A method of processing a received signal, comprising the steps of:
   subjecting the received signal to a feedforward filter to compensate for channel noise, and producing a fedforward received signal;
   combining the fedforward received signal, a soft feedback signal and a tentative delayed hard feedback signal into a combined signal;
   subjecting a first portion of the combined signal to a soft decision metric to produce a soft output;
   subjecting a second portion of the combined signal to a decoder to produce a tentative hard decoded signal with delay;
   subjecting the soft output to a first feedback filter to produce the soft feedback signal; and
   subjecting the tentative hard decoded signal to a second feedback filter to produce the tentative delayed hard feedback signal.

16. The method of claim 15, further comprising the step of decoding the combined signal and outputting a decoded output.

17. The method of claim 16, wherein the step of decoding comprises the step of decoding the combined received signal using a Viterbi decoder.

18. The method of claim 15, wherein the first feedback filter delays the soft feedback signal by a period D, and the soft feedback signal suppresses interference from symbols $x_{n-1}$, $x_{n-2}$, ... $x_{n-D}$.

19. The method of claim 15, wherein B is the total number of feedback filter taps used in the first feedback filter and the second feedback filter, and the tentative delayed hard feedback signal cancels interference from symbols $x_{n-D-1}$, $x_{n-D-2}$, ... $x_{n-B}$.

20. The method of claim 15, wherein the received signal represents an information signal encoded using a convolutional code.

21. The method of claim 20, wherein the convolutional code has constraint length K, and D=K.

22. The method of claim 15, wherein the step of subjecting the combined signal to a soft decision metric comprises the step of computing the soft decision metric as:

$$\tilde{x}_n = \frac{1}{\sqrt{2}}\left(\tanh\left(\sqrt{2}\,\gamma\,\text{Re}(y_n)\right) + j\tanh\left(\sqrt{2}\,\gamma\,\text{Im}(y_n)\right)\right),$$

where $\gamma$ is a received signal-to-noise ratio parameter and $y_n$ is the combined signal.

23. The method of claim 15, wherein the step of subjecting the combined signal to a soft decision metric comprises the step of computing the soft decision metric as:

$$\tilde{x}_N = \frac{\sum_{\forall s_n}\sum_{s_{n-1}(s_n)} x(s_{n-1}, s_n) P(y_{n-1}, s_{n-1}) P(y_n \mid x(s_{n-1}, s_n))}{\sum_{\forall s_n}\sum_{s_{n-1}(s_n)} P(y_{n-1}, s_{n-1}) P(y_n \mid x(s_{n-1}, s_n))}, \text{ where}$$

where $$P(x_n \mid y_n) = \frac{\sum_{\forall s_n} P(x_n, y_n, s_n)}{\sum_{\forall s_n} P(y_n, s_n)}$$

and $s_n$ represents a state of the decoding at time n.

24. A system for processing a received signal, comprising:
- a feedforward filter, filtering the received signal to compensate for channel noise, and producing a fedforward received signal;
- a combining unit, connected to the feedforward filter, and combining the fedforward received signal, a soft feedback signal and a tentative delayed hard feedback signal into a combined signal;
- a soft decision unit, connected to the combining unit, and receiving the combined signal and subjecting a first portion of the combined signal to a soft decision metric to produce a soft output;
- a decoder, connected to the combining unit, and decoding a second portion of the combined signal to produce a tentative hard decoded signal with delay;
- a first feedback filter, connected to the soft decision unit and to the combining unit, and producing the soft feedback signal; and
- a second feedback filter, connected to the decoder and to the combining unit, and producing the tentative delayed hard feedback signal.

25. The system of claim 24, wherein the first feedback filter delays the soft feedback signal by a period D, and the soft feedback signal suppresses interference from symbols $x_{n-1}, x_{n-2}, \ldots x_{n-D}$.

26. The system of claim 24, wherein B is the total number of feedback filter taps in the first feedback filter and the second feedback filter, and the tentative delayed hard feedback signal cancels interference from symbols $x_{n-D-1}, x_{n-D-2}, \ldots x_{n-B}$.

27. The system of claim 24, wherein the received signal represents an information signal encoded using a convolutional code.

28. The system of claim 27, wherein the convolutional code has constraint length K, and D=K.

29. The system of claim 24, wherein the decoder comprises a Viterbi decoder.

30. The system of claim 24, wherein the soft decision unit subjects the combined signal to a soft decision metric computed as:

$$\tilde{x}_n = \frac{1}{\sqrt{2}}\left(\tanh(\sqrt{2}\,\gamma\,\text{Re}(y_n)) + j\tanh(\sqrt{2}\,\gamma\,\text{Im}(y_n))\right),$$

where $\gamma$ is an received parameter and $y_n$ is the combined signal.

31. The system of claim 24, wherein the soft decision unit subjects the combined signal to a soft decision metric computed as:

$$\tilde{x}_N = \frac{\sum_{\forall s_n} \sum_{s_{n-1}(s_n)} x(s_{n-1}, s_n) P(y_{n-1}, s_{n-1}) P(y_n \mid x(s_{n-1}, s_n))}{\sum_{\forall s_n} \sum_{s_{n-1}(s_n)} P(y_{n-1}, s_{n-1}) P(y_n \mid x(s_{n-1}, s_n))},$$

where $$P(x_n \mid y_n) = \frac{\sum_{\forall s_n} P(x_n, y_n, s_n)}{\sum_{\forall s_n} P(y_n, s_n)}$$

and $s_n$ represents a state of the decoder at time n.

* * * * *